(12) United States Patent
Chen et al.

(10) Patent No.: US 11,476,124 B2
(45) Date of Patent: Oct. 18, 2022

(54) ETCHANT FOR ETCHING A COBALT-CONTAINING MEMBER IN A SEMICONDUCTOR STRUCTURE AND METHOD OF ETCHING A COBALT-CONTAINING MEMBER IN A SEMICONDUCTOR STRUCTURE

(71) Applicant: TAIWAN SEMICONDUCTOR MANUFACTURING COMPANY LTD., Hsinchu (TW)

(72) Inventors: Ren-Kai Chen, Hsinchu (TW); Li-Chen Lee, Hsinchu (TW); Shun Wu Lin, Taichung (TW); Ming-Hsi Yeh, Hsinchu (TW); Kuo-Bin Huang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/141,882

(22) Filed: Jan. 5, 2021

(65) Prior Publication Data
US 2022/0216066 A1  Jul. 7, 2022

(51) Int. Cl.
*H01L 21/3213* (2006.01)
*C09K 13/10* (2006.01)
*C09K 13/06* (2006.01)
*H01L 29/45* (2006.01)

(52) U.S. Cl.
CPC ........ *H01L 21/32134* (2013.01); *C09K 13/06* (2013.01); *C09K 13/10* (2013.01); *H01L 29/456* (2013.01)

(58) Field of Classification Search
None
See application file for complete search history.

(56) References Cited

U.S. PATENT DOCUMENTS

| | | | | |
|---|---|---|---|---|
| 6,251,780 B1 * | 6/2001 | Sohn | ................ | H01L 21/28052 438/683 |
| 6,566,254 B1 * | 5/2003 | Mikagi | ............. | H01L 21/28052 257/E21.165 |
| 6,849,532 B2 * | 2/2005 | Kim | .................... | H01L 29/6659 438/592 |
| 10,490,417 B2 * | 11/2019 | Dory | ................. | H01L 21/02057 |

(Continued)

*Primary Examiner* — Allan W. Olsen
(74) *Attorney, Agent, or Firm* — WPAT, P.C., Intellectual Property Attorneys; Anthony King

(57) ABSTRACT

A method of etching a cobalt-containing member in a semiconductor structure includes providing an etchant including a fluorine-free acid and an alkaline solution having a pH value between 8.5 and 13, and etching the cobalt-containing member in the semiconductor structure using the etchant, wherein a rate of etching the cobalt-containing member by the etchant is substantially greater than a rate of etching a nitride-containing member by the etchant. An etchant for etching a cobalt-containing member in a semiconductor structure includes a fluorine-free acid, and an alkaline solution having a pH value between 8.5 and 13; wherein a rate of etching a cobalt-containing member by the etchant is substantially greater than a rate of etching a nitride-containing member by the etchant, and a level of dissolved oxygen of the etchant is substantially less than or equal to 100 ppb.

20 Claims, 15 Drawing Sheets

(56) References Cited

U.S. PATENT DOCUMENTS

| | | | |
|---|---|---|---|
| 10,619,126 B2* | 4/2020 | Sugishima | C11D 7/3281 |
| 2015/0111804 A1* | 4/2015 | Dory | C11D 3/0073 |
| | | | 510/175 |
| 2015/0255309 A1* | 9/2015 | Nishiwaki | H01L 21/32134 |
| | | | 438/754 |
| 2017/0110363 A1* | 4/2017 | Aoyama | H01L 21/76814 |
| 2018/0040623 A1* | 2/2018 | Kanakamedala | |
| | | | H01L 27/11548 |
| 2020/0347297 A1* | 11/2020 | Kneer | H01L 21/32134 |

* cited by examiner

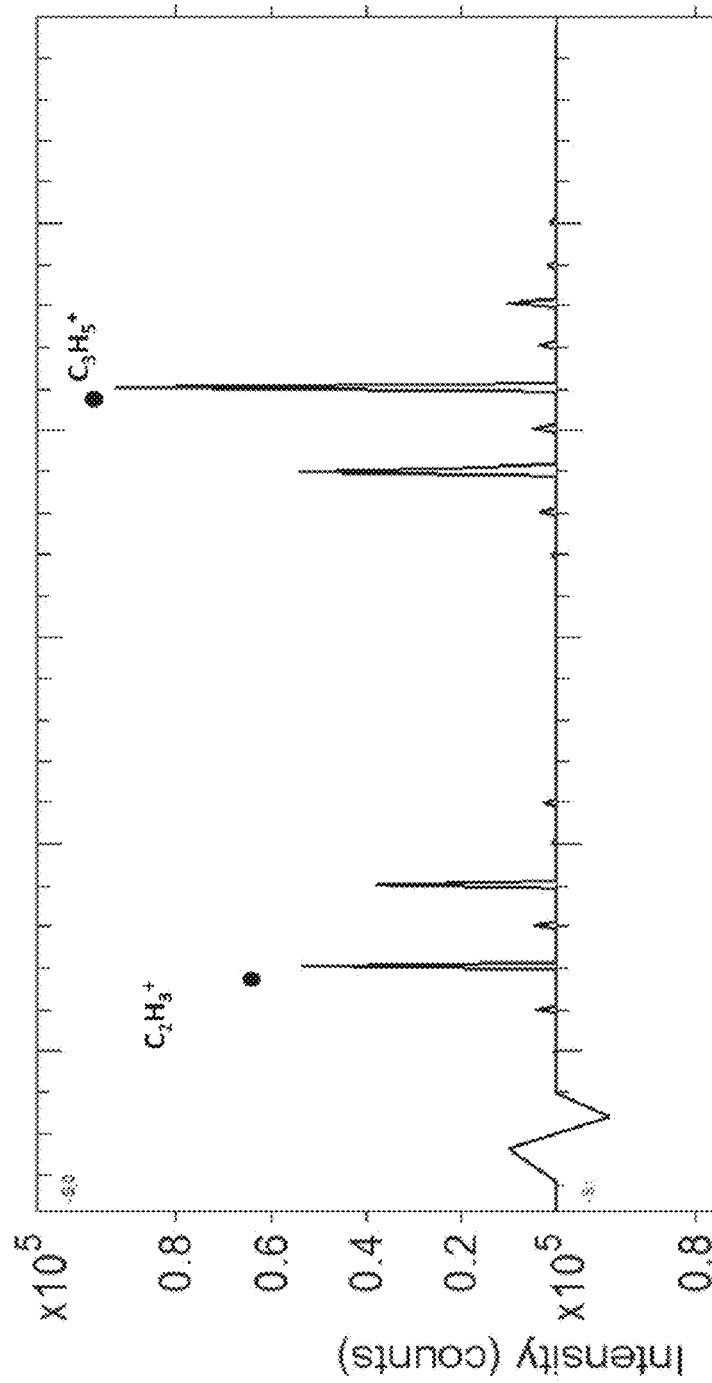
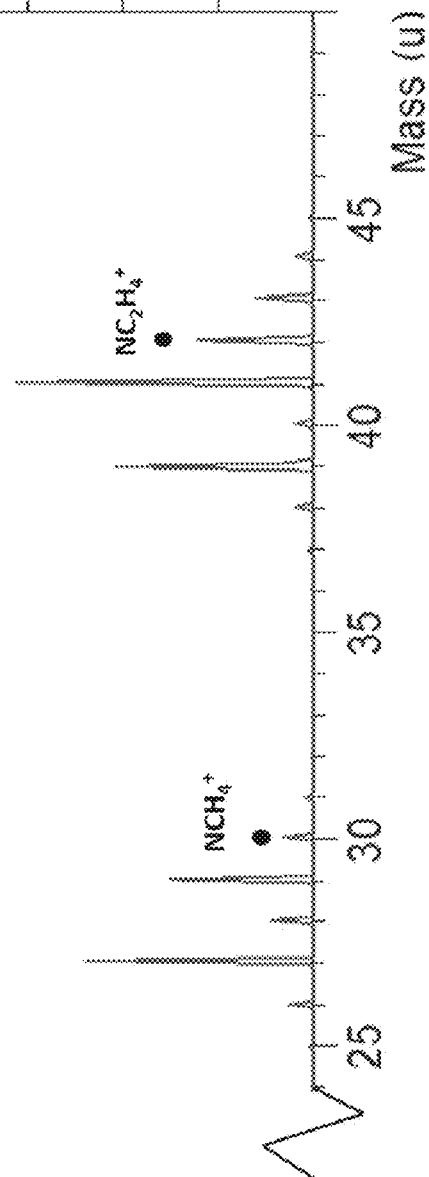
FIG. 9A
FIG. 9B

ETCHANT FOR ETCHING A COBALT-CONTAINING MEMBER IN A SEMICONDUCTOR STRUCTURE AND METHOD OF ETCHING A COBALT-CONTAINING MEMBER IN A SEMICONDUCTOR STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling-down process provides broad benefits by increasing production efficiency and lowering associated costs while increasing the amount of functionality that can be provided in the reduced chip area. Such scaling down has also increased complexities of processing and manufacturing ICs, and quality control of the products has become more stringent.

For example, contacts are used across multiple dielectric layers as metal interconnects. As the scaling-down continues, contact areas become smaller and smaller. As interface areas between contacts and other components decrease, any unevenness or residue on the interface renders semiconductor structures unusable. Improvements in these areas are desired.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIGS. 9A and 9C are mass spectrums illustrating residues formed by performing the methods in accordance with some embodiments of the present disclosure.

FIGS. 9B and 9D are mass spectrums illustrating residues formed by performing some comparative embodiments.

DETAILED DESCRIPTION

Figure 1:
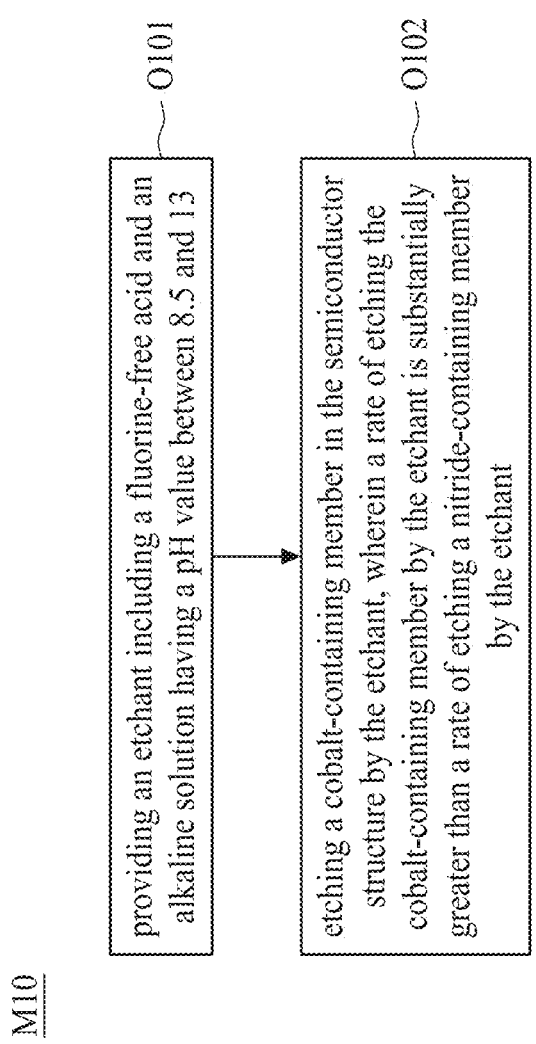
FIG. 1 is a flowchart showing various steps of a method of etching cobalt in a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about," Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

An interconnect structure is formed over a transistor of a semiconductor in order to electrically connect the transistor to an external electronic device. In order to provide electrical connection between the transistor and the interconnect structure, one or more contacts are formed in dielectric layers to electrically interconnect, for instance, a source/drain of the transistor and the interconnect structure. As a scale of the transistor is significantly smaller than a scale of an external electronic device, the contact needs to be accurately formed in a predetermined position without damaging the surrounding structure and while having a predetermined shape. However, existing etchants can only be obtained through a specific channel, and surfaces formed after etching by the existing etchants tend to lack sufficient flatness or have residue remaining thereon. Etched surfaces that are not flat enough or have residues will bond poorly to the interconnect structure. In the present disclosure, a method of etching a cobalt-containing member in a semiconductor structure by bulk chemical is provided to reduce surface roughness, wherein the method can be easily integrated with a conventional manufacturing method of a semiconductor structure. An etchant for etching a cobalt-containing member in a semiconductor structure is also provided.

FIG. 1 is a flowchart showing a method M10 of etching a cobalt-containing member in a semiconductor structure in accordance with some embodiments of the present disclosure. The method M10 includes several operations: (O101) providing an etchant including a fluorine-free acid and an alkaline solution having a pH value between 8.5 and 13; and (O102) etching the cobalt-containing member in the semiconductor structure by the etchant, wherein a rate of etching the cobalt-containing member by the etchant is substantially greater than a rate of etching a nitride-containing member by the etchant.

Figure 2:
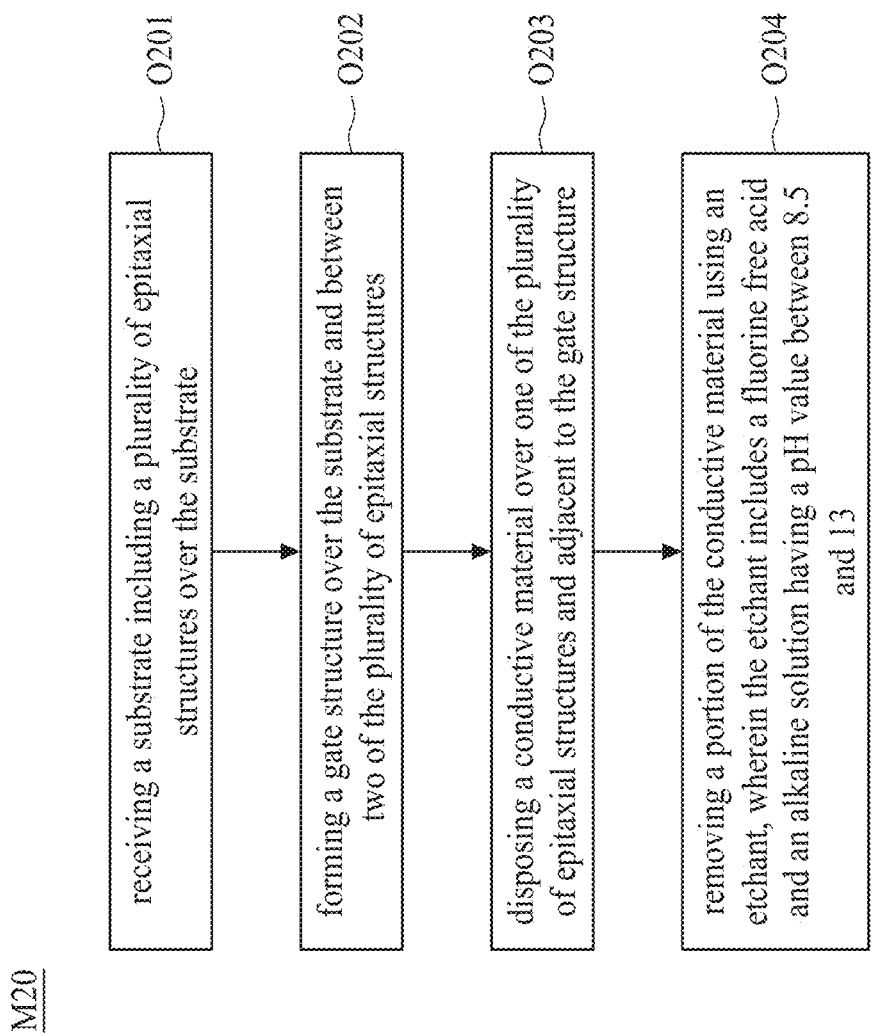
FIG. 2 is a flowchart showing various steps of a method for forming a semiconductor structure in accordance with some embodiments of the present disclosure.

FIG. 2 is a flowchart showing a method M20 for forming a semiconductor structure in accordance with some embodiments of the present disclosure. The method M20 includes several operations: (O201) receiving a substrate including a plurality of epitaxial structures over the substrate; (O202) forming a gate structure over the substrate and between two of the plurality of epitaxial structures; (O203) disposing a conductive material over one of the plurality of epitaxial structures and adjacent to the gate structure; and (O204) removing a portion of the conductive material using an etchant, wherein the etchant includes a fluorine-free acid and an alkaline solution having a pH value between 8.5 and 13.

In order to illustrate concepts and the methods M10 and M20 of the present disclosure, various embodiments are provided below. However, the present disclosure is not intended to be limited to specific embodiments. In addition, elements, conditions or parameters illustrated in different embodiments can be combined or modified to form different combinations of embodiments as long as the elements, parameters or conditions used are not in conflict. For ease of illustration, reference numerals with similar or same functions and properties are repeated in different embodiments and figures.

Figure 3:
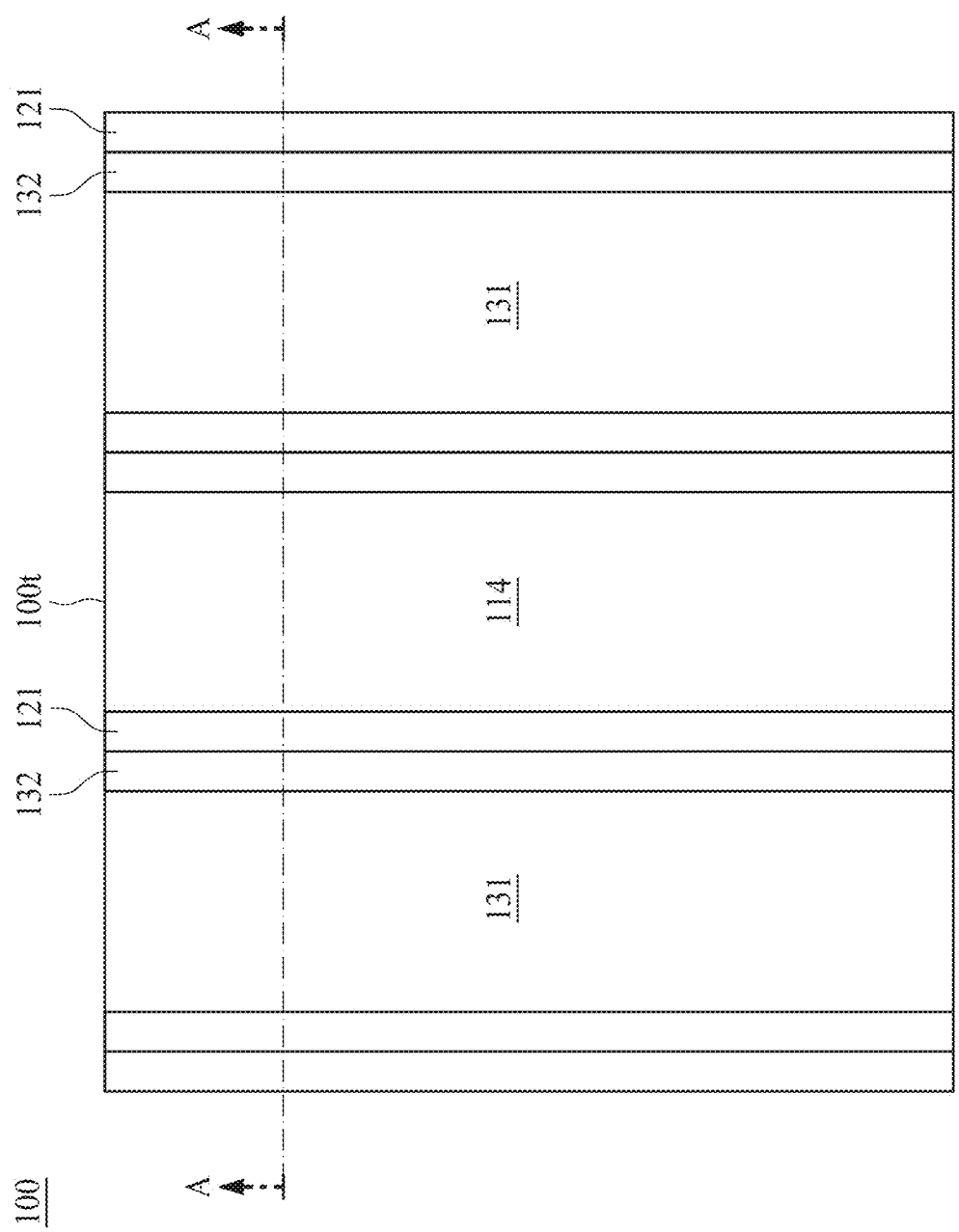
FIG. 3 is a schematic top view of one of the various steps of a method of etching cobalt in a semiconductor structure and/or a method for forming a semiconductor structure in accordance with some embodiments of the present disclosure.
Figure 4:
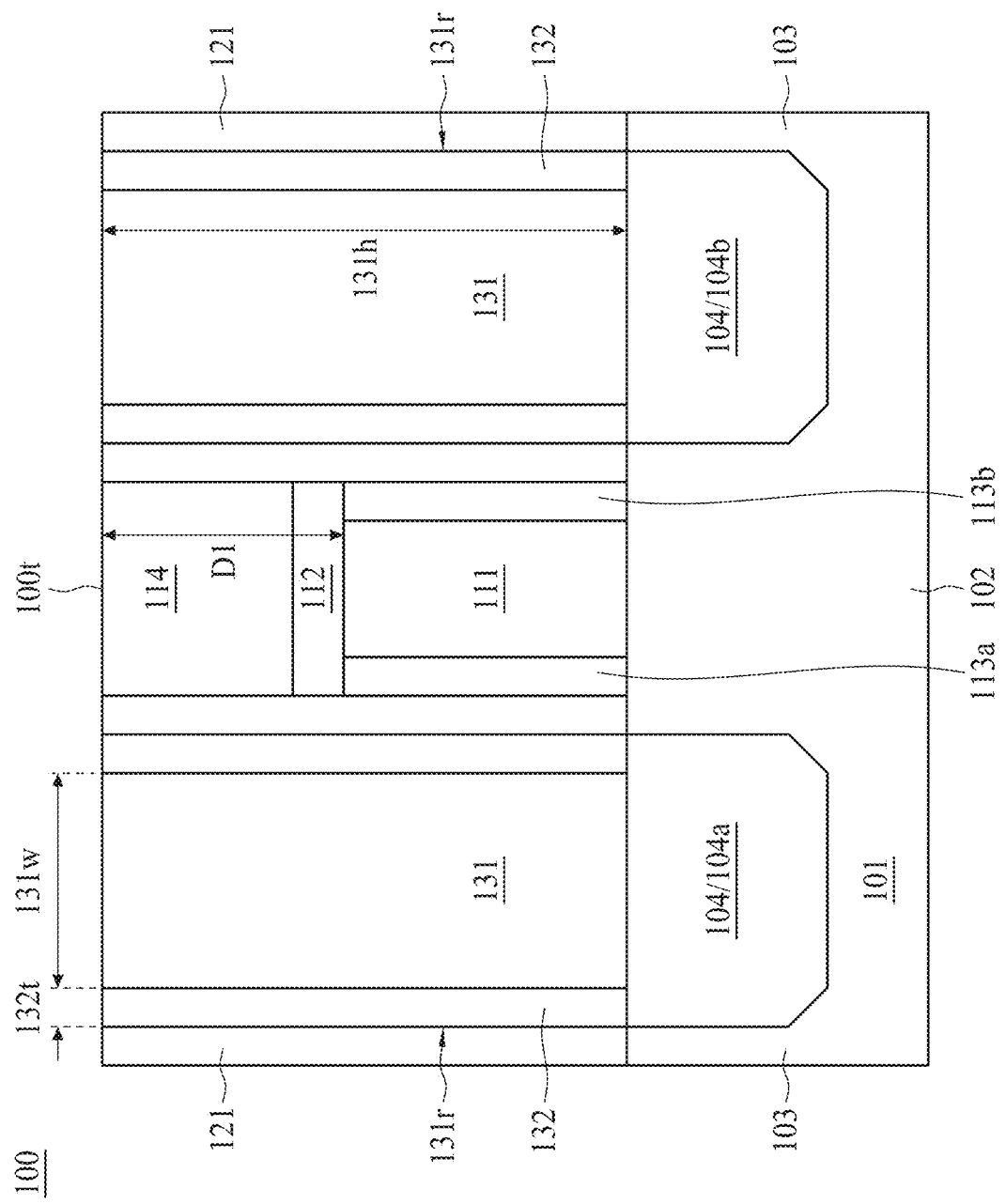
FIG. 4 is a schematic cross-sectional diagram taken along a line A-A in FIG. 3.

FIG. 3 is schematic top view illustrating a semiconductor structure 100 of the method M10 or the operations O201 to O203 of the method M20 in accordance with some embodiments of the present disclosure. FIG. 4 is a schematic cross-sectional view taken along a line A-A in FIG. 3.

A semiconductor structure 100 is provided or received as shown in FIGS. 3 and 4. In some embodiments, referring to FIGS. 3 and 4, the semiconductor structure 100 is formed by the operations O201 to O203 of the method M20. In some embodiments, a top surface loot of the semiconductor structure 100 is planarized by, for example, chemical mechanical planarization (CMP). It should be understood that the semiconductor device 100 may be fabricated using a planar FET technology process flow or a FinFET technology process flow. Further, the semiconductor device 100 may include various other devices and features, such as other types of transistors including bipolar junction transistors, resistors, capacitors, diodes, fuses, etc. Accordingly, FIGS. 3 and 4 have been simplified for the sake of clarity to provide better understanding of the inventive concepts of the present disclosure. Moreover, additional features can be added in the semiconductor device 100, and some of the features described below can be replaced or eliminated in other embodiments of the semiconductor device 100.

In some embodiments, in operation O201, a substrate 101 including a plurality of epitaxial structures 104 over the substrate 101 is received. In some embodiments, the semiconductor structure 100 includes the substrate 101, an active region 102 disposed over the substrate 101, and an isolation structure 103 that isolates the epitaxial structures 104 from other active regions (not shown).

The substrate 101 may be a semiconductor substrate (e.g., a silicon wafer). In some embodiments, the substrate 101 may include another elementary semiconductor, such as germanium; a compound semiconductor including silicon carbide, gallium nitride, gallium arsenide, gallium phosphide, indium phosphide, indium arsenide or indium antimonide; an alloy semiconductor including silicon germanium, gallium arsenide phosphide, aluminum indium phosphide, aluminum gallium arsenide, gallium indium arsenide, gallium indium phosphide or gallium indium arsenide phosphide; or a combination thereof. The substrate 101 may include indium tin oxide (ITO) glass or a silicon on insulator (SOI) substrate, may be strained and/or stressed for performance enhancement, and may include epitaxial regions, doped regions, and/or other suitable features or layers.

In some embodiments, the active region 102 is disposed between epitaxial structures 104. The active region 102 may include one or more layers of semiconductor materials such as silicon or silicon germanium, and may be doped with dopants suitable for forming active or passive devices. In an embodiment, the active region 102 includes multiple alternating layers of semiconductor materials (e.g., multiple layers of silicon and multiple layers of silicon germanium alternately stacked). The active region 102 may be a planar structure, for example, for forming planar transistors. In some embodiments, the active region 102 may include three-dimensional (3D) structures such as fins, e.g., for forming multi-gate or 3D transistors such as FinFETs. Various active and passive devices may be disposed in or over the active region 102, such as p-type field-effect transistors (PFETs), n-type FETs (NFETs), multi-gate such as FinFETs, metal-oxide semiconductor field-effect transistors (MOSFETs), complementary metal-oxide semiconductor (CMOS) transistors, bipolar transistors, high-voltage transistors, high-frequency transistors, static random-access memory (SRAM) cells, other memory cells, resistors, capacitors, and inductors.

In some embodiments, a plurality of isolation structures 103 are disposed over the substrate 101 and adjacent to the epitaxial structures 104. In some embodiments, each of the epitaxial structures 104 is disposed between the active region 102 and the corresponding isolation structures 103. In some embodiments, the active region 102 and the epitaxial structures 104 are disposed between the isolation structures 103. In some embodiments, the size and shape of each of the isolation structures 103 is not particularly limited, and may be same or different and may be adjusted according to the actual needs.

In some embodiments, the isolation structure 103 includes $SiO_2$, $Si_3N_4$, SiON, fluoride-doped silicate glass (FSG), a low-k dielectric material, and/or other suitable insulating materials. In some embodiments, the isolation structure 103 is formed by etching trenches in or over the substrate 101 (e.g., as part of the process of forming the active region 102), filling the trenches with an insulating material, and performing a CMP process and/or an etch-back process on the insulating material, thereby leaving the remaining insulating material as the isolation structures 103. Other types of isolation structures may also be suitable, such as field oxide and local oxidation of silicon (LOCOS). The isolation structures 103 may include a multi-layer structure, for example, having one or more liner layers (on surfaces of the substrate 101 and the active region 102) and a main isolating layer over the one or more liner layers.

In some embodiments, the epitaxial structures 104 are transistor source/drain features 104a, 104b. The source/drain features 104a, 104b may include n-type doped silicon for NFETs, p-type doped silicon germanium for PFETs, or other suitable materials. The source/drain features 104a, 104b may be formed by etching depressions in the active region 102, and then epitaxially growing semiconductor materials in the depressions. The epitaxially-grown semiconductor materials may be doped with suitable divan s in-situ or ex-situ. The source/drain features 104a, 104b may have any suitable shape and may be wholly or partially embedded in the active region 102. In some embodiments, the size and shape of each of the source/drain features 104a, 104b is not particularly limited, and may be same or different and may be adjusted according to the actual needs.

In operation O202, a gate structure 111 is formed over the substrate 101 and between two of the plurality of epitaxial structures 104. In some embodiments, the gate structure 111 is disposed between the source/drain features 104a, 104b. Persons having ordinary skill in the art would understand that the number of the gate structures 111 shown in FIG. 3 merely serves as an exemplary illustration, and different numbers of the gate structure 111 can be included.

In some embodiments, forming the gate structure 111 includes forming a plurality of layers. For example, an interfacial layer, a gate dielectric layer, a high-k layer, a capping layer, a work function metal, and a gate electrode may be deposited and included in the gate structure 111. The high-k layer may include hafnium oxide (HfO2). In some embodiments, the high-k layer may optionally include other high-k dielectrics, such as $TiO_2$, HfZrO, $Ta_2O_3$, $HfSiO_4$, $ZrO_2$, $ZrSiO_2$, other suitable materials, or combinations thereof. Further, the high-k layer may include a multiple layer configuration such as $HfO_2/SiO_2$ or $HfO_2/SiON$. A suitable work function metal may include, for example, TiAl, TaN or WN. In some embodiments, the work function metal may be any suitable metal. The material of the gate electrode may include any suitable material, for example, a metal including Al, W, or Cu, or polysilicon. The gate structure 111 may be formed by chemical vapor deposition (CND), physical vapor deposition (PVD), atomic layer deposition (ALD), high-density plasma CVD (HDPCVD), plating, other suitable methods, or a combination thereof. In some embodiments, the gate structure 111 is a gate stack.

In some embodiments, a hard mask layer 112 is formed over the gate structure 111. The hard mask 112 may include a material such as silicon nitride, silicon oxynitride, silicon carbide, silicon carbon nitride, other suitable material, or a combination thereof. In some embodiments, the hard mask 112 includes silicon nitride and is formed by CND, PVD, ALD, HDPCVD, a spin-on-dielectric process (SOD), other suitable methods, or a combination thereof.

In some embodiments, the method M20 further includes forming gate spacers 113a, 113b over the active region 102 and adjacent to the gate electrode 111. The size and shape of each of the gate spacers 113a, 113b is not particularly limited, and may be same or different and may be adjusted according to the actual needs. In some embodiments, the gate spacers 113a, 113b are formed before the formation of the gate structure 111. In some embodiments, the gate spacers 113a, 113b are formed on opposite sides of the gate structure 111, such as disposed on sidewalk of the gate structure 111 and over the substrate 101. The gate spacers 113a, 113b are formed by any suitable process to have any suitable thickness. For example, the gate spacers 113a, 113b may be formed by depositing a dielectric material, such as silicon nitride, silicon oxide, silicon oxynitride, silicon carbide, silicon germanium, other suitable materials, or a combination thereof, and patterning the material to form the gate spacers 113a, 113b. The deposition process may include CVD, low-pressure chemical vapor deposition (LPCVD), PVD, ALD, HDPCVD, plating, sputtering, other suitable methods, or a combination thereof. In some embodiments, at least one of the gate spacers 113a, 113b includes silicon nitride.

In some embodiments, the method M20 further includes forming a protective dielectric layer 114 over the gate structure 111. In some embodiments, the protective dielectric layer 114 is formed over the hard mask 112. In some embodiments, the protective dielectric layer 114 is formed over the gate structure 111, the hard mask 112 and the spacers 113a, 113b. In some embodiments, a top surface of the protective dielectric layer 114 is substantially level with the top surface 100t of the semiconductor structure 100. In some embodiments, the protective dielectric layer 114 is a nitride-containing member. In some embodiments, the protective dielectric layer 114 is an oxide-containing member. The protective dielectric layer 114 and an interlayer dielectric (ILD) 121 may include different materials such that subsequent processing may selectively remove one of the materials without removing the other. In some embodiments, a first distance D1 between the top surface of the protective dielectric layer 114 and the gate structure 111 is between 10 and 30 nm.

The protective dielectric layer 114 is formed by any suitable process to have any suitable thickness. For example, the protective dielectric layer 114 may be formed by depositing a protective dielectric material, such as silicon nitride, silicon oxide, silicon oxynitride, silicon carbide, silicon germanium, other suitable materials, or a combination thereof, and patterning the material to form the protective dielectric layer 114. The deposition process may include CVD, LPCVD, PVD, ALD, HDPCVD, plating, sputtering, other suitable methods, or a combination thereof. In some embodiments, after the depositing of the protective dielectric material, a planarization process, such as a CMP process, may be performed to remove the excess portions of the protective dielectric material of the protective dielectric layer 114 and to planarize the top surface 100$t$ of the semiconductor structure 100. The resulting remaining portions of the protective dielectric material thus form the protective dielectric layer 114. In some embodiments, the protective dielectric layer 114 includes silicon nitride.

In some embodiments, the method M20 further includes forming an interlayer dielectric (ILD) 121 over the substrate 101, the active region 102 and the isolation structures 103. In some embodiments, the gate structure 111 is surrounded by the ILD 121. In some embodiments, the gate structure 111, the spacers 113$a$, 113$b$, the hard mask layer 112 and the protective dielectric layer 114 are surrounded by the ILD 121. In some embodiments, a top surface of the ILD 121 is substantially level with the top surface 100$t$ of the semiconductor structure 100. In some embodiments, the ILD 121 is a nitride-containing member. In some embodiments, the ILD 121 is an oxide-containing member. In some embodiments, the ILD 121 includes a plurality of ILD sub-layers (not shown) disposed over the substrate 101.

In some embodiments, the ILD 121 is a flowable film formed by a flowable CVD. In some embodiments, the ILD 121 is formed of oxides such as silicon oxide, phosphosilicate glass (PSG), boro-silicate glass (BSG), boron-doped phospho-silicate glass (BPSG), undoped silicate glass (USG), low-k dielectrics such as carbon-doped oxides, extremely low-k dielectrics such as porous carbon-doped silicon dioxide, a polymer such as polyimide, the like, or a combination thereof. The low-k dielectric materials may have k values lower than 3.9. The ILD 121 may be deposited by any suitable method such as CVD, ALD, SOD, the like, or a combination thereof. In some embodiments, a planarization process, such as a CMP process, may be performed to level the top surface of the ILD 121 with the top surface of the protective dielectric layer 114.

In some embodiments, in operation O203, a conductive material is disposed over one of the plurality of epitaxial structures 104 and adjacent to the gate structure 111. In some embodiments, the conductive material includes cobalt and forms a cobalt-containing member 131. In some embodiments, the cobalt-containing member 131 is formed by patterning the ILD 121 to form a first recess 131$r$, and disposing the conductive material into the first recess 131$r$. In some embodiments, the epitaxial structures 104 are exposed through the first recess 131$r$. In some embodiments, a plurality of the cobalt-containing members 131 are formed, and each of the cobalt-containing members 131 is attached to the corresponding source/drain features 104$a$, 104$b$. In some embodiments, each of the cobalt-containing members 131 is a contact electrically connected to the corresponding source/drain features 104$a$, 104$b$. In some embodiments, the size and shape of each of the cobalt-containing members 131 is not particularly limited, and may be same or different and may be adjusted according to the actual needs.

In some embodiments, each of the cobalt-containing members 131 has a width 131$w$ between 10 and 50 nm. In some embodiments, the cobalt-containing member 131 has the width 131$w$ between 10 and 20 nm. In some embodiments, the cobalt-containing member 131 has a height 131$h$ between 10 and 50 nm, in some embodiments, the cobalt-containing member 131 has the width 131$w$ between 20 and 40 nm. In some embodiments, the height 131$h$ is greater than the width 131$w$. In some embodiments, the height 131$h$ of the cobalt-containing member 131 is about 30 nm. In some embodiments, the height 131$h$ is greater than the first distance D1 between the top surface of the protective dielectric layer 114 and the gate structure 111.

In some embodiments, the cobalt-containing member 131 is surrounded by the ILD 121. In some embodiments, the cobalt-containing member 131 further includes tungsten, aluminum, the like, or a combination thereof. The cobalt-containing member 131 may be formed through a deposition process such as electrochemical plating, PVD, CVD, the like, or a combination thereof. In some embodiments, the cobalt-containing member 131 is formed on a copper-containing seed layer (not shown), such as AlCu.

In some embodiments, the method M20 further includes forming a barrier layer 132 in the first recess 131$r$ before disposing the conductive material into the first recess 131$r$. In some embodiments, the barrier layer 132 is formed on the sidewall of the first recess 131$r$, and a portion of each of the epitaxial structures 104 is exposed through the barrier layer 132. In some embodiments, the barrier layer 132 is disposed between the ILD 121 and the cobalt-containing members 131. In some embodiments, the barrier layer 132 surrounds at least a portion of the cobalt-containing members 131. The barrier layer 132 helps to block diffusion of the subsequently-formed cobalt-containing member 131 into adjacent dielectric materials such as the ILD 121. The barrier layer 132 may include titanium, titanium nitride, tantalum, tantalum nitride, manganese, manganese oxide, cobalt, cobalt oxide, cobalt nitride, nickel, nickel oxide, nickel nitride, silicon carbide, oxygen-doped silicon carbide, nitrogen-doped silicon carbide, silicon nitride, aluminum oxide, aluminum nitride, aluminum oxynitride, a polymer such as polyimide, polybenzoxazole (PBO), the like, or a combination thereof. In some embodiments, the barrier layer 132 includes titanium nitride. The barrier layer 132 may be formed by CND, PVD, PECVD, ALD, SOD, the like, or a combination thereof. In some embodiments, the barrier layer is omitted. In some embodiments, the barrier layer 132 has a thickness between 1 and 5 nm. In some embodiments, the thickness 132$t$ of the barrier layer 132 is about 1.5 nm to about 2 nm. In some embodiments, the cobalt-containing member 131 has the width 131$w$ between 1 and 2.5 nm.

In some embodiments, after the conductive material is disposed, the conductive material includes an excessive portion above the top surface of the ILD 121. In some embodiments, the conductive material is planarized by a grinding process such as a CMP process to form the cobalt-containing member 131 in the first recess 131$r$. In some embodiments, a top surface of the cobalt-containing member 131 is level with the top surface of the ILD 121 after the planarization process. In some embodiments, the top surface of the cobalt-containing member 131 is coplanar with the top surface of the ILD 121, a top surface of the barrier layer 132, and the top surface of the protective dielectric layer 114. In some embodiments, the top surface 100t of the semiconductor structure 100 includes the top surface of the cobalt-containing member 131, the top surface of the ILD 121, the top surface of the barrier layer 132, and the top surface of the protective dielectric layer 114.

In some embodiments, in operations O201 to O203 of the method M20, the substrate 101 and a plurality of epitaxial structures 104 over the substrate 101 are received, and the gate structure 111, the protective dielectric layer 114, the ILL) 121, the barrier layer 132 and the cobalt-containing member 131 are formed sequentially over the substrate 101. In some embodiments, each of the protective dielectric layer 114, the ILD 121 and the barrier layer 132 is a nitride-containing member or an oxide-containing member. In some embodiments, the protective dielectric layer 114 and the ILD 121 include same or different dielectric materials. In some embodiments, the protective dielectric layer 114 and the ILD 121 include nitride. In some embodiments, the protective dielectric layer 114 and the ILL) 121 are nitride-containing members. In some embodiments, the nitride-containing member at least partially surrounds the cobalt-containing member 131.

Figure 5:
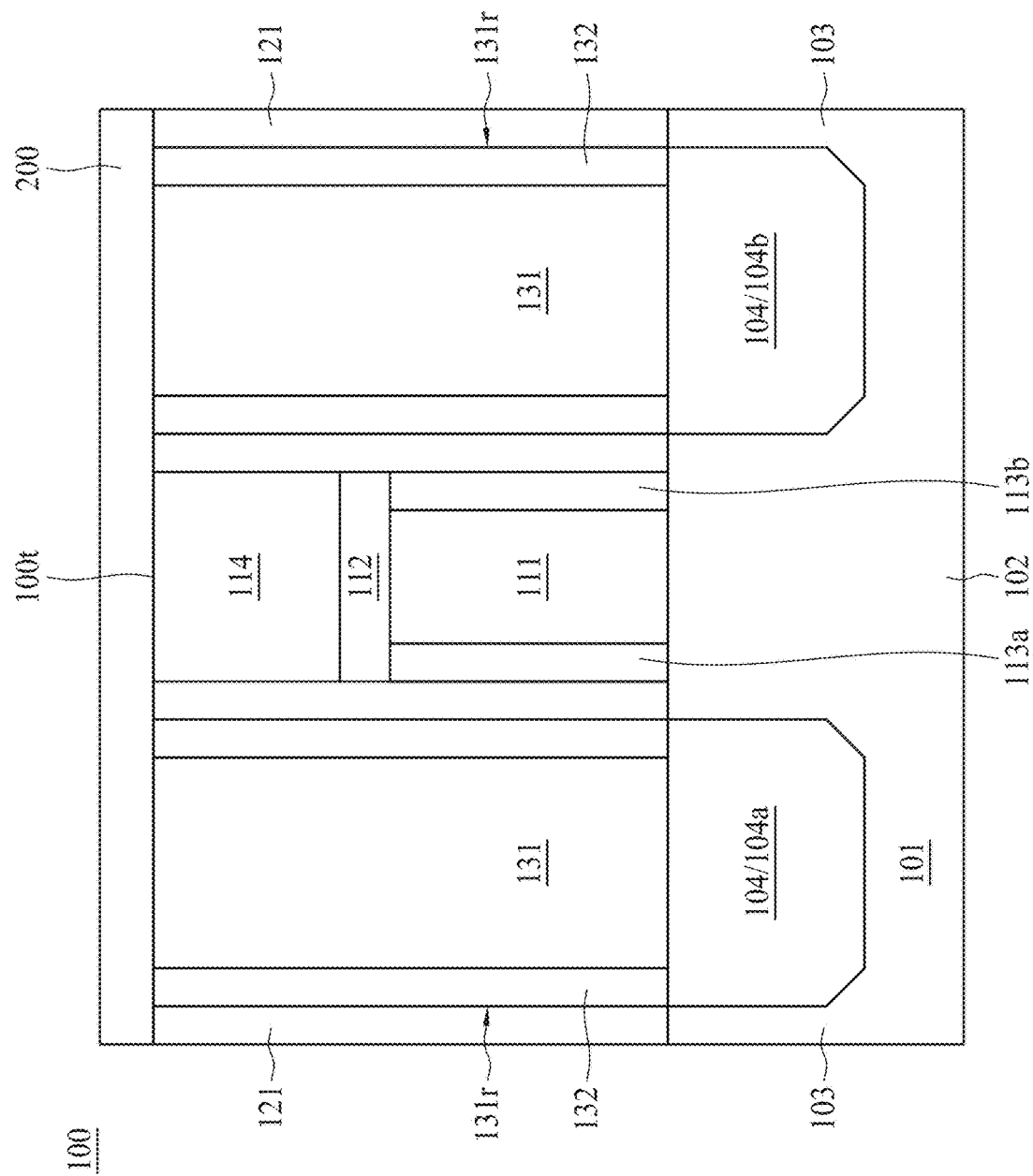
FIGS. 5 and 6 are cross-sectional diagrams of various steps of a method of etching cobalt in a semiconductor structure and/or a method for forming a semiconductor structure in accordance with some embodiments of the present disclosure.

FIG. 5 is a schematic cross-sectional view illustrating the operation O101 of the method M10 or the etchant in operation O204 of the method M20 in accordance with some embodiments of the present disclosure. In operation O101, an etchant 200 including a fluorine-free acid and an alkaline solution having a pH value between 8.5 and 13 is provided.

In some embodiments, referring to FIG. 5, the etchant 200 is disposed over the top surface 100t of the semiconductor structure 100. In some embodiments, the cobalt-containing member 131 has an etching rate different from an etching rate of the ILD 121 with respect to the etchant 200. In some embodiments, the etching rate of the cobalt-containing member 131 is different from an etching rate of an oxide-containing member with respect to the etchant 200. In some embodiments, the rate of etching the cobalt-containing member 131 by the etchant 200 is substantially greater than a rate of etching a nitride-containing member by the etchant 200, In some embodiments, the rate of etching the cobalt-containing member 131 by the etchant 200 is substantially greater than a rate of etching the oxide-containing member by the etchant 200. In some embodiments, the rate of etching the nitride-containing member by the etchant 200 is substantially equal to zero. In some embodiments, the rate of etching the oxide-containing member by the etchant 200 is substantially equal to zero. In some embodiments, the etchant 200 is free of benzene.

In some embodiments, the cobalt-containing member 131 has an etching rate different from an etching rate of the protective dielectric layer 114 with respect to the etchant 200. In some embodiments, the barrier layer 132 includes a material different from those of the ILD 121 and the protective dielectric layer 114. In some embodiments, the cobalt-containing member 131 has an etching rate different from an etching rate of the barrier layer 132 with respect to the etchant 200. In some embodiments, the cobalt-containing member 131 has an etching rate different from an etching rate of the barrier layer 132 with respect to the etchant 200.

In some embodiments, the fluorine-free acid is selected from a group consisting of: aliphatic monocarboxylic acids having 1 to 18 carbon atoms, aliphatic dicarboxylic acids having 1 to 2 carbon atoms, aromatic carboxylic acids, sulfonic acids having 1 to 20 carbon atoms, hydrochloric acid, hydrobromic acid, sulfuric acid, sulfurous acid, phosphoric acid, phosphorous acid, polyphosphoric acid, nitric acid and perchloric acid. In some embodiments, the fluorine-free acid is hydrochloric acid.

In some embodiments, the methods M10 and M20 further include adjusting a pH value of the etchant 200 to a value between 2 and 6. In some embodiments, the methods M10 and M20 further include adjusting a pH value of the fluorine-free acid to a value between 2 and 6. In some embodiments, the methods M10 and M20 further include adjusting a concentration of the fluorine-free acid to a concentration between 0.1 vol % and 10 vol %. In one embodiment, the fluorine-free acid includes hydrochloric acid blended water with an $HCl:H_2O$ volume ratio of 1:25.

In some embodiments, the alkaline solution includes an alkaline compound, wherein the alkaline compound is selected from a group consisting of: ammonia solution, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, 1,8-diazabicyclo-[5,4,0]-7-undecene, sodium hydroxide, potassium hydroxide, sodium carbonate, sodium bicarbonate, sodium silicate, and sodium metasilicate. In some embodiments, the alkaline solution includes ammonia solution. In one embodiment, the alkaline solution includes ammonia-blended water with an $NH_3:H_2O$ volume ratio of 1:25.

Figure 6:
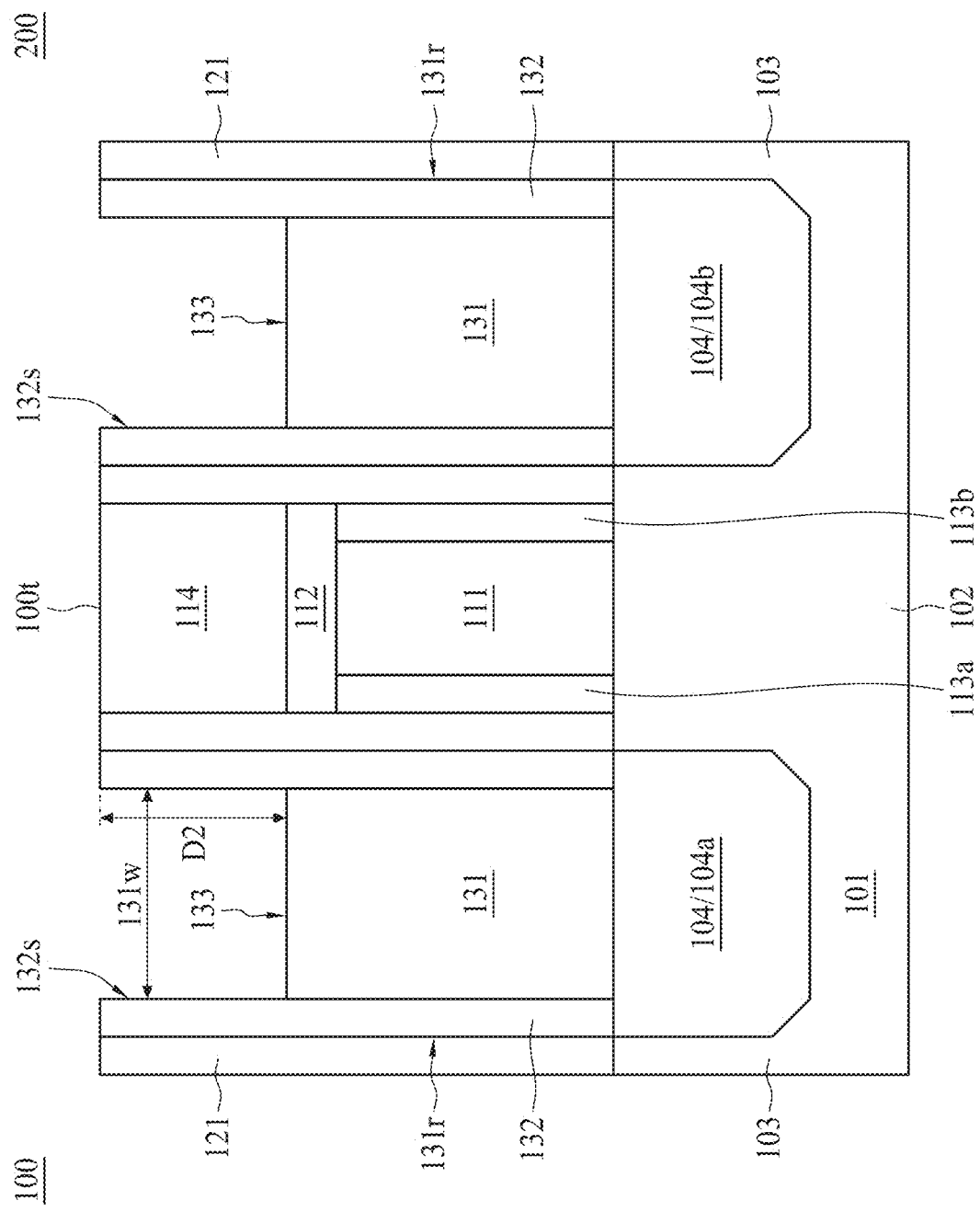

FIG. 6 is a schematic cross-sectional view illustrating a semiconductor structure after the performing of the operation O102 of the method M10 or the operation O204 of the method M20 in accordance with some embodiments of the present disclosure. In operation O102 of the method M10, referring to FIG. 6, the cobalt-containing member 131 in the semiconductor structure 100 is etched using the etchant 200. In operation O204 of the method M20, a portion of the conductive material is removed using the etchant 200. In some embodiments, a portion of each of the cobalt-containing members 131 is removed using the etchant 200, and a surface 133 is formed by removing the portion of each of the cobalt-containing members 131. In some embodiments, the etchant 200 etches the cobalt-containing member 131 without damaging the nitride-containing member or the oxide-containing member of the semiconductor structure 100. In some embodiments, the etchant 200 etches the cobalt-containing member 131 without damaging the barrier layer 132, the ILD 121, or the protective dielectric layer 114. In some embodiments, a sidewall 132s of the barrier layer 132 is exposed after the portions of the cobalt-containing members 131 are removed. When the etchant 200 is used, the second distance D2 between the top surface loot of the semiconductor structure 100 and the surface 133 of the cobalt-containing member 131 is correlated to the width 131w, which leads to a bowl-shaped cross-sectional profile. In some embodiments, a second distance D2 between the top surface 100t of the semiconductor structure 100 and the surface 133 of the cobalt-containing member 131 is between 5 and 30 nm, and preferably between 10 and 20 nm. In some embodiments, the second distance D2 is about 15 nm. In some embodiments, the width 131w is about 10 nm to about 20 nm. In some embodiments, the width 131w is about 10 nm. Following the operation O102 of the method M10 or the operation O204 of the method M20, the etchant 200 is removed.

In some embodiments, the surface 133 is substantially level with the top surface of the hard mask layer 112. In some embodiments, the surface 133 is substantially level with the top surface of the gate structure 111. In some embodiments, the surfaces 133 of each of the cobalt-containing members 131 are substantially level with each other. In some embodiments, the surfaces 133 of each of the cobalt-containing members 131 are offset from each other.

In some embodiments, the methods M10 and M20 further include adjusting a level of dissolved oxygen of the etchant 200 to less than or substantially equal to 100 ppb. In some embodiments, the surface 133 has a surface roughness (the distance between the highest point and the lowest point of the surface 133) between 5 and 25 nm. In some embodiments, the surface 133 has a surface roughness between 5 and 15 nm. In some embodiments, adjusting the level of dissolved oxygen of the etchant 200 to less than or substantially equal to 100 ppb causes the surface roughness of the surface 133 to be between 5 and 20 nm. In some embodiments, the surface 133 is free of residues disposed thereon. In some embodiments, any residues formed during operation O102 of the method M10 or the operation O204 of the method M20 on the top surfaces 133 of the cobalt-containing member 131 are removed.

Figure 7:
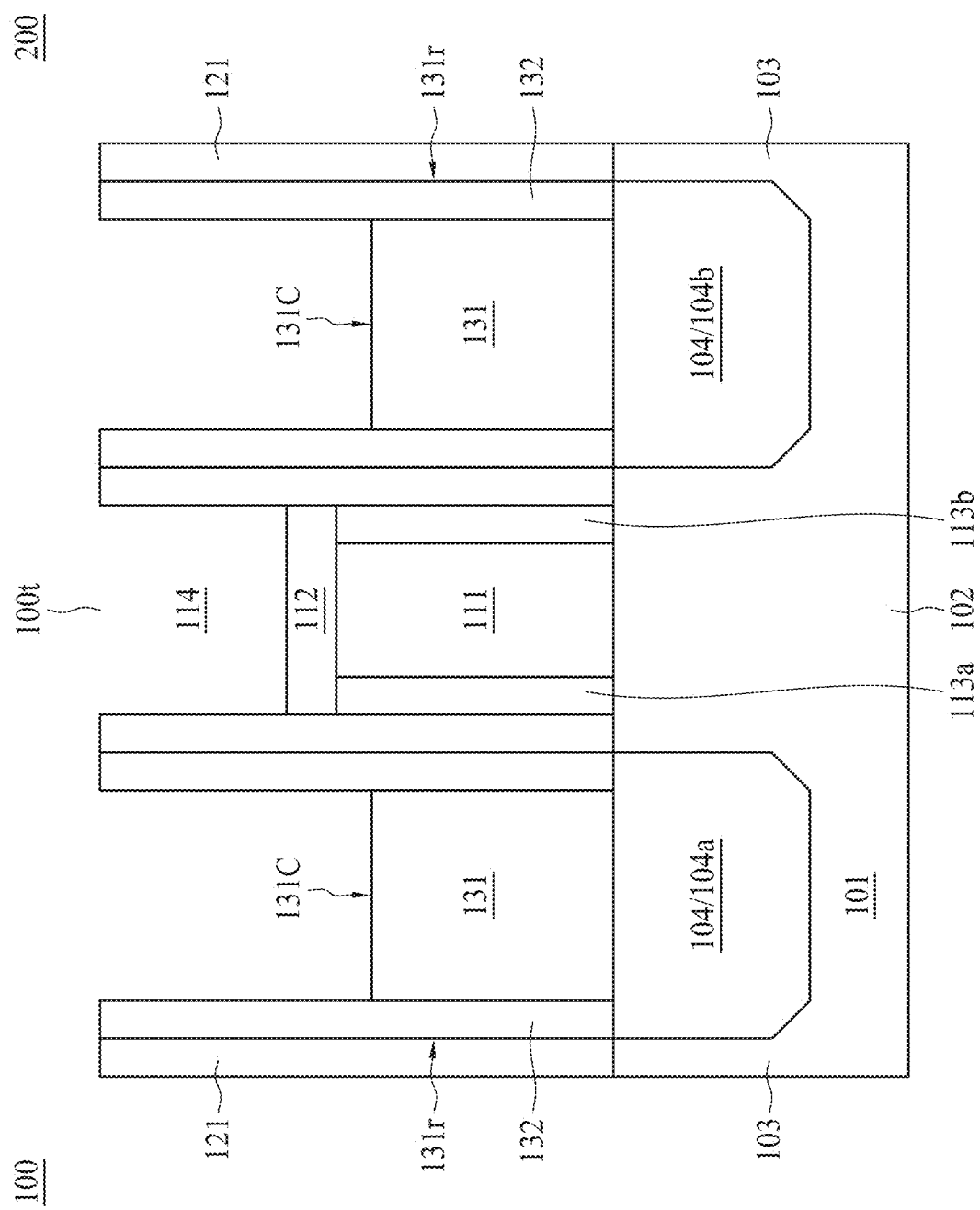
FIG. 7 is a schematic cross-sectional diagram of a semiconductor device in accordance with some comparative embodiments.

FIG. 7 is a schematic cross-sectional view of a semiconductor device in accordance with a first comparative embodiment. In the first comparative embodiment, referring to FIG. 7, a first comparative etchant has a level of dissolved oxygen greater than 3000 ppb, and a surface 131c formed by removing a portion of the cobalt-containing member 131 by the first comparative etchant has a surface roughness greater than 20 nm. In some comparative embodiments, the first comparative etchant includes the fluorine-free acid and the alkaline solution having a pH value between 8.5 and 13, wherein the first comparative etchant has not been deoxidized. In some comparative embodiments, the surface 131c has a surface roughness between 25 and 50 nm. In some embodiments, the etchant 200 has an etching rate less than an etching rate of the first comparative etchant with respect to the cobalt-containing member 131. In some comparative embodiments, for etching the cobalt-containing member 131, the etching rate of the first comparative etchant is twice that of the etchant 200.

Figure 8B:
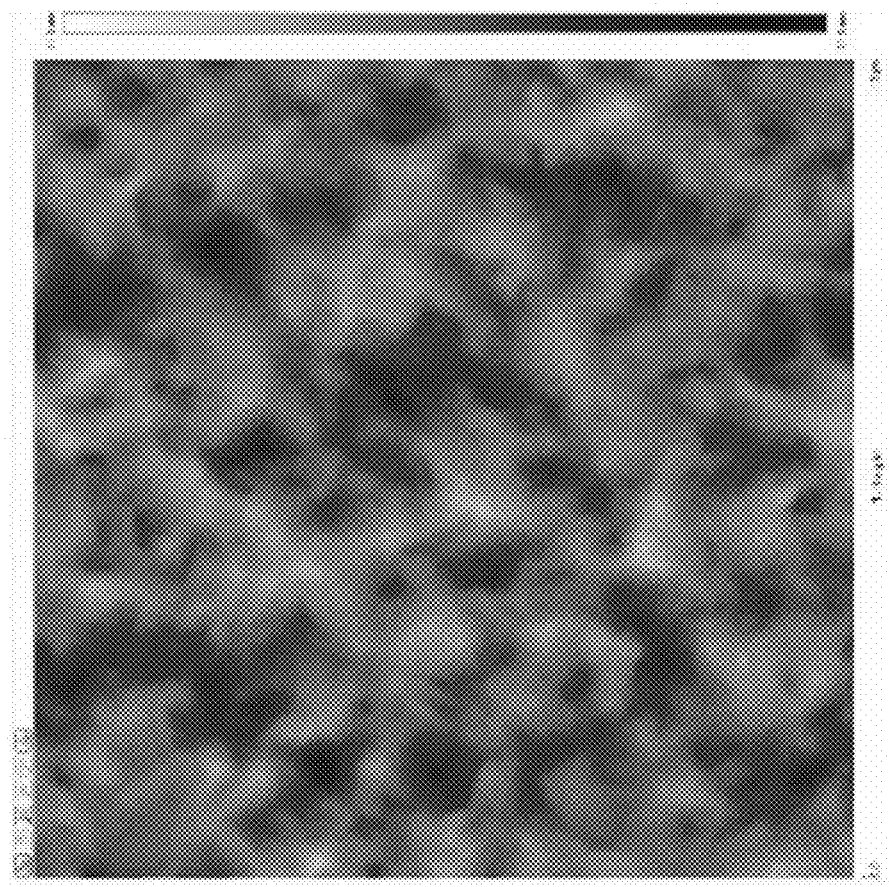
FIG. 8B is an AFM image illustrating a surface formed by performing some comparative embodiments.
Figure 8A:
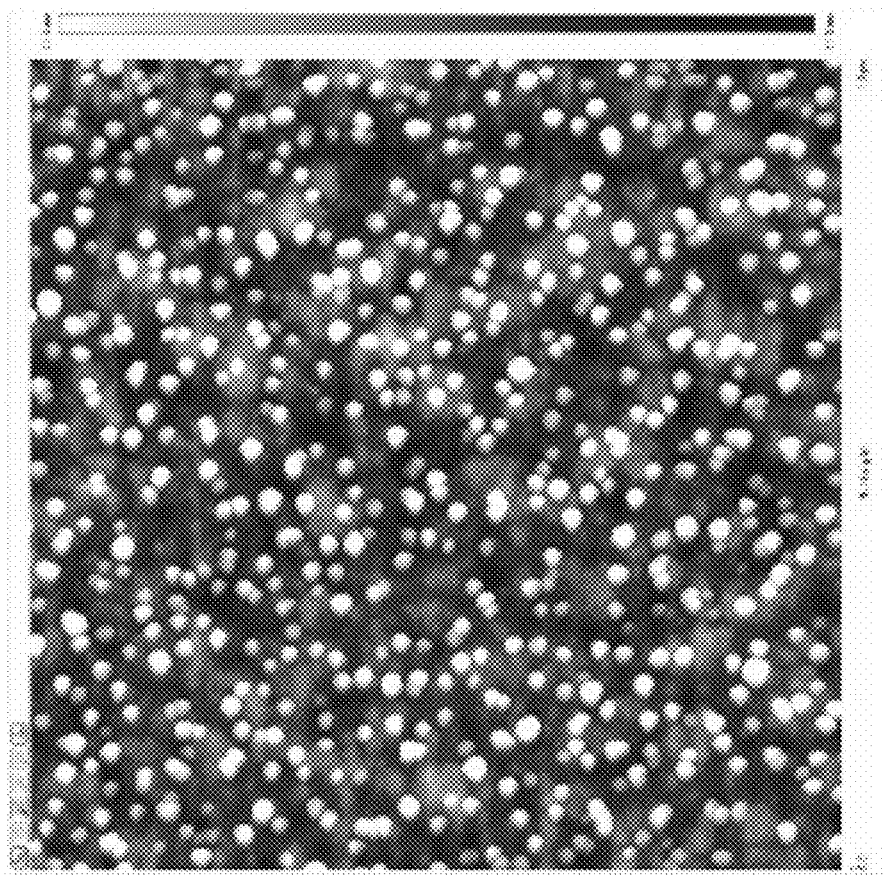
FIG. 8A is an atomic force microscope (AFM) image illustrating a surface formed by performing the methods in accordance with some embodiments of the present disclosure.

FIG. 8A is an atomic force microscopy (AFM) image illustrating the surface 133 formed by performing operation O102 of the method M10 or the operation O204 of the method M20 in accordance with some embodiments of the present disclosure. FIG. 8B is an AFM image illustrating a surface 131c formed by removing a portion of the cobalt-containing member 131 using a second comparative etchant. In a second comparative embodiment, the second comparative etchant including benzene is provided or received. In some comparative embodiments, the surface 131c is formed by removing a portion of the cobalt-containing member 131 by the second comparative etchant, wherein the surface 131c has some residues disposed thereon. The residues may be organic residues, such as $NCH_4^+$, $NC_2H_4^+$, $CN^-$, $CNO^-$, or combinations thereof. In some embodiments, comparing the surface 133 formed using the etchant 200 to the surface 131c formed using the second comparative etchant, the surface 133 has less residue disposed thereon than that disposed on the surface 131c. Comparing FIG. 8A to 8B, the surface 133 is more uniform than the surface 131c.

FIG. 9A is a mass spectrum illustrating positive ions of the residues disposed on the surface 133 after the performing of operation O102 of the method M10 or the operation O204 of the method M20 in accordance with some embodiments of the present disclosure. FIG. 9B is a mass spectrum illustrating positive ions of the residues disposed on the surface 131c after the removal of a portion of the cobalt-containing member 131 by the second comparative etchant. In some embodiments, the positive ions such as $NCH_4$ and $NC H_4$ disposed on the surface 131c are greater in number than those disposed on the surface 133. In some embodiments, the surface 133 is substantially free of $NCH_4^+$ and $NC_2H_4^+$.

Figures 9C, 9D:
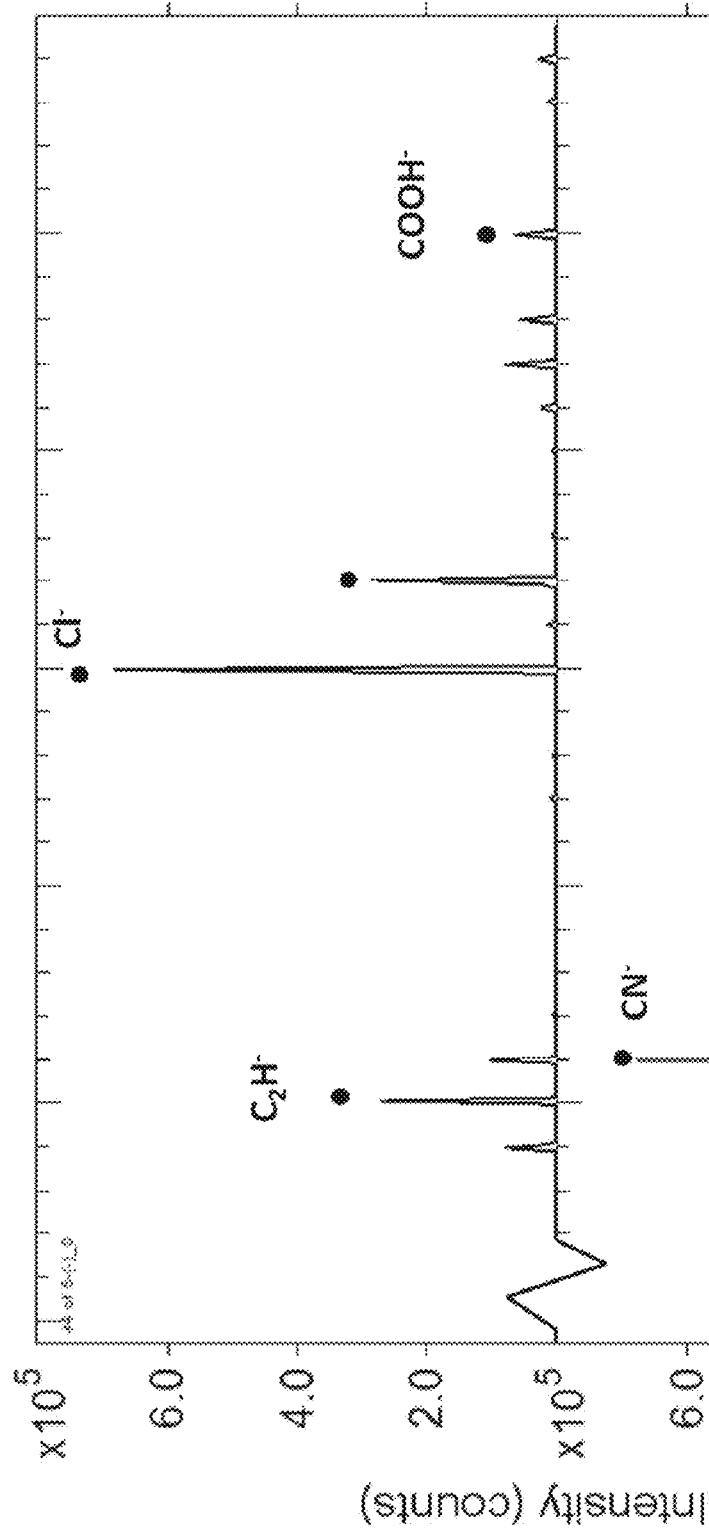

FIG. 9C is a portion of a mass spectrum illustrating negative ions of the residues disposed on the surface 133 after the performing of operation O102 of the method M10 or the operation O204 of the method M20 in accordance with some embodiments of the present disclosure. FIG. 9B is a portion of a mass spectrum illustrating negative ions of the residues disposed on the surface 131c after the removal of a portion of the cobalt-containing member 131 using the second comparative etchant. In some embodiments, negative ions such as $CN^-$ and $CNO^-$ disposed on the surface 131c are greater in number than those disposed on the surface 133.

Figure 10:
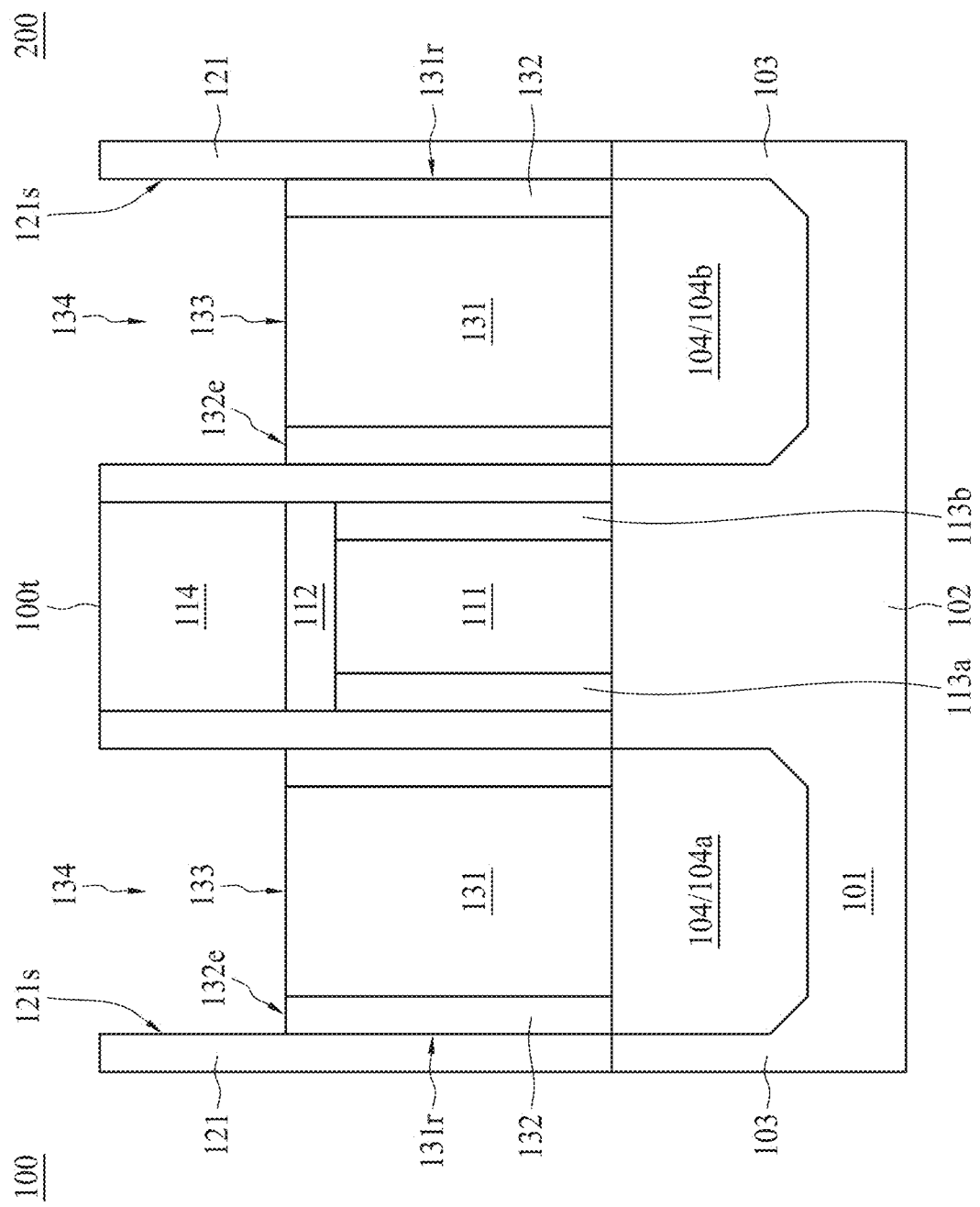
FIG. 10 is a schematic cross-sectional diagram of one of the various steps of a method for forming a semiconductor structure in accordance with some embodiments of the present disclosure.

FIG. 10 is a schematic cross-sectional view illustrating a semiconductor structure in accordance with some embodiments of the present disclosure. In some embodiments, after the removal of a portion of the cobalt-containing member 131 using the etchant 200 in the operation O102 of the method M10 or the operation O204 of the method M20, a portion of the barrier layer 132 is removed to form a surface 132e. In some embodiments, the surface 132e is substantially level with the surface 133 of the corresponding cobalt-containing member 131. The barrier layer 132 is removed using a suitable etchant that does not etch the cobalt-containing member 131. In some embodiments, a portion of a sidewall 121s of the ILD 121 is exposed after the portions of the cobalt-containing member 131 and the barrier layer 132 are removed, and a second recess 134 is formed. In some embodiments, the second recess 134 is formed on the top surface 100t of the semiconductor structure 100. In some embodiments, the second recess 134 is surrounded by the ILI) 121. In some embodiments, a plurality of the second recesses 134 are formed on each of the cobalt-containing members 131, wherein the size and shape of each of the second recesses 134 is not particularly limited, and may be same or different and may be adjusted according to the actual needs.

Figure 11:
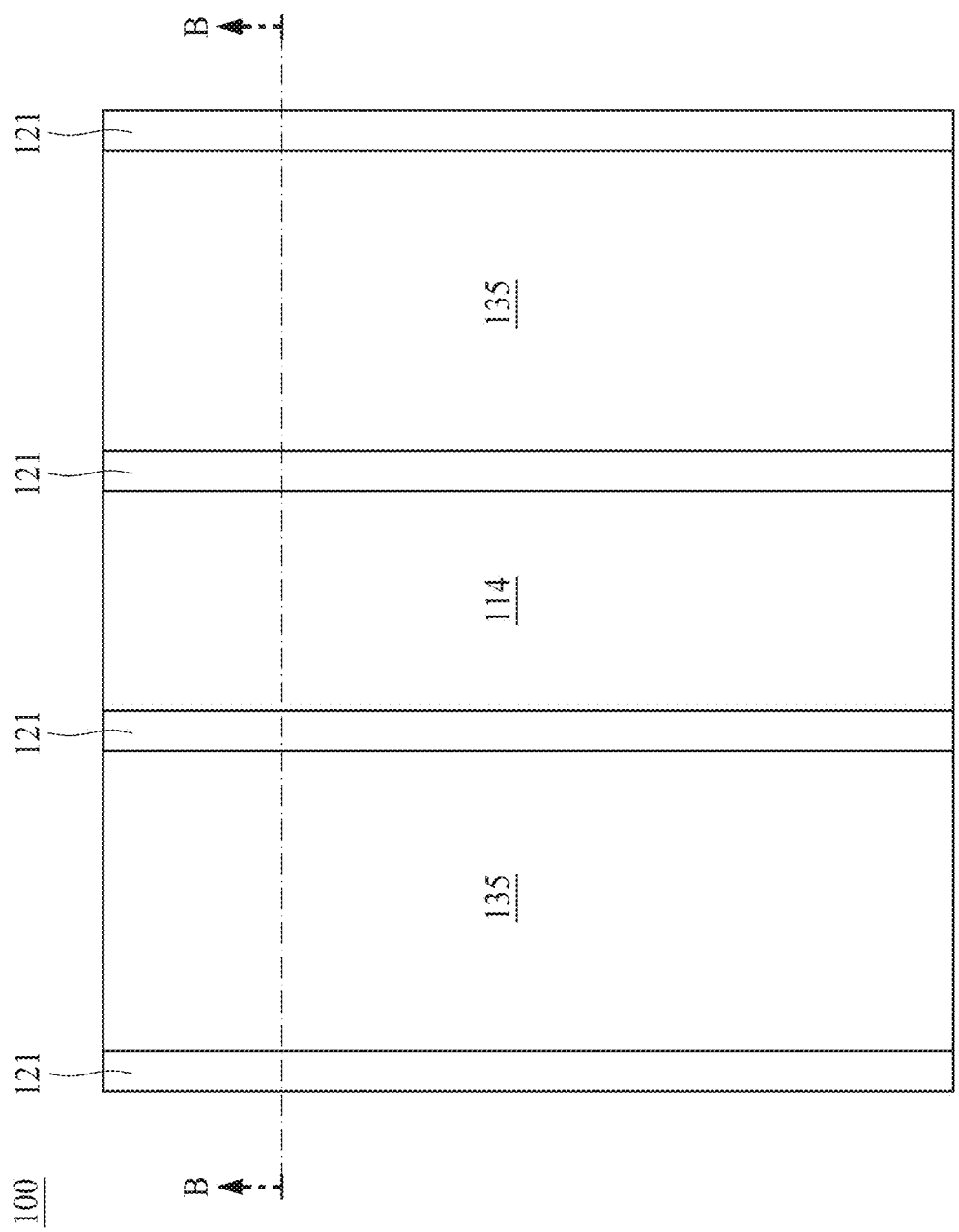
FIG. 11 is a schematic top view of one of the various steps of a method for forming a semiconductor structure in accordance with some embodiments of the present disclosure.
Figure 12:
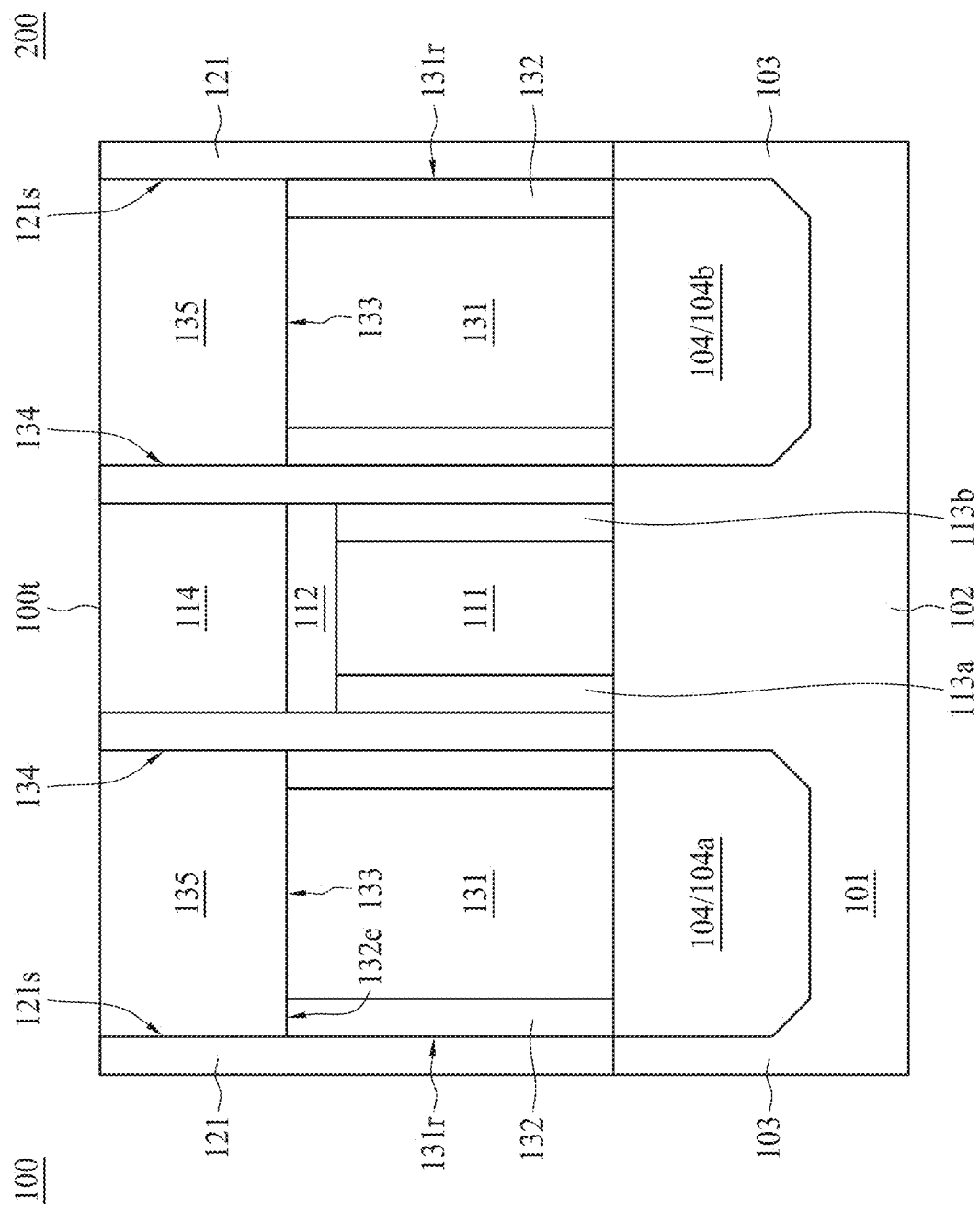
FIG. 12 is a schematic cross-sectional diagram taken along a line B-B in FIG. 11.

FIG. 11 is a schematic top view illustrating a semiconductor structure of the method M10 and method M20 in accordance with some embodiments of the present disclosure. FIG. 12 is a schematic cross-sectional view taken along a line B-B in FIG. 11. In some embodiments, referring to FIGS. 11 and 12, a dielectric member 135 is formed in the second recess 134. In some embodiments, the dielectric member 135 is disposed on the cobalt-containing member 131 and the remaining portion of the barrier layer 132. In some embodiments, the dielectric member 135 is attached to the surface 133 of the cobalt-containing member 131. In some embodiments, the dielectric member 135 is attached to the surface 132t of the barrier layer 132. In some embodiments, the dielectric member 135 is attached to the sidewall 121s of the ILD 121. In some embodiments, the dielectric member 135 includes a dielectric material, such as silicon nitride, silicon oxide, silicon oxynitride, silicon carbide, silicon germanium, other suitable materials, or a combination thereof. The dielectric member 135 may be formed by depositing the dielectric material. The deposition process may include CVD, low-pressure chemical vapor deposition (LPCVD), PVD, ALD, HDPCVD, plating, sputtering, other suitable methods, and/or combinations thereof. In some embodiments, the dielectric member 135 includes silicon nitride. In some embodiments, a plurality of alignment members 135 are formed in the second recesses 134. In some embodiments, the size and shape of each of the alignment members 135 is not particularly limited, and may be same or different and may be adjusted according to the actual needs.

In some embodiments, the dielectric member 135 is formed to cover the top surface of the ILD 121 and the top surface of the protective dielectric layer 114. In some embodiments, a planarization (e.g., CMP) is performed on the dielectric member 135 to remove portions of the dielectric member 135 until the protective dielectric layer 114 and/or the ILD 121 is exposed as shown in FIGS. 11 and 12. In some embodiments, the dielectric member 135 has a top surface substantially coplanar with a top surface of the ILD layer 121 and the protective dielectric layer 114 after the planarization.

Figure 13:
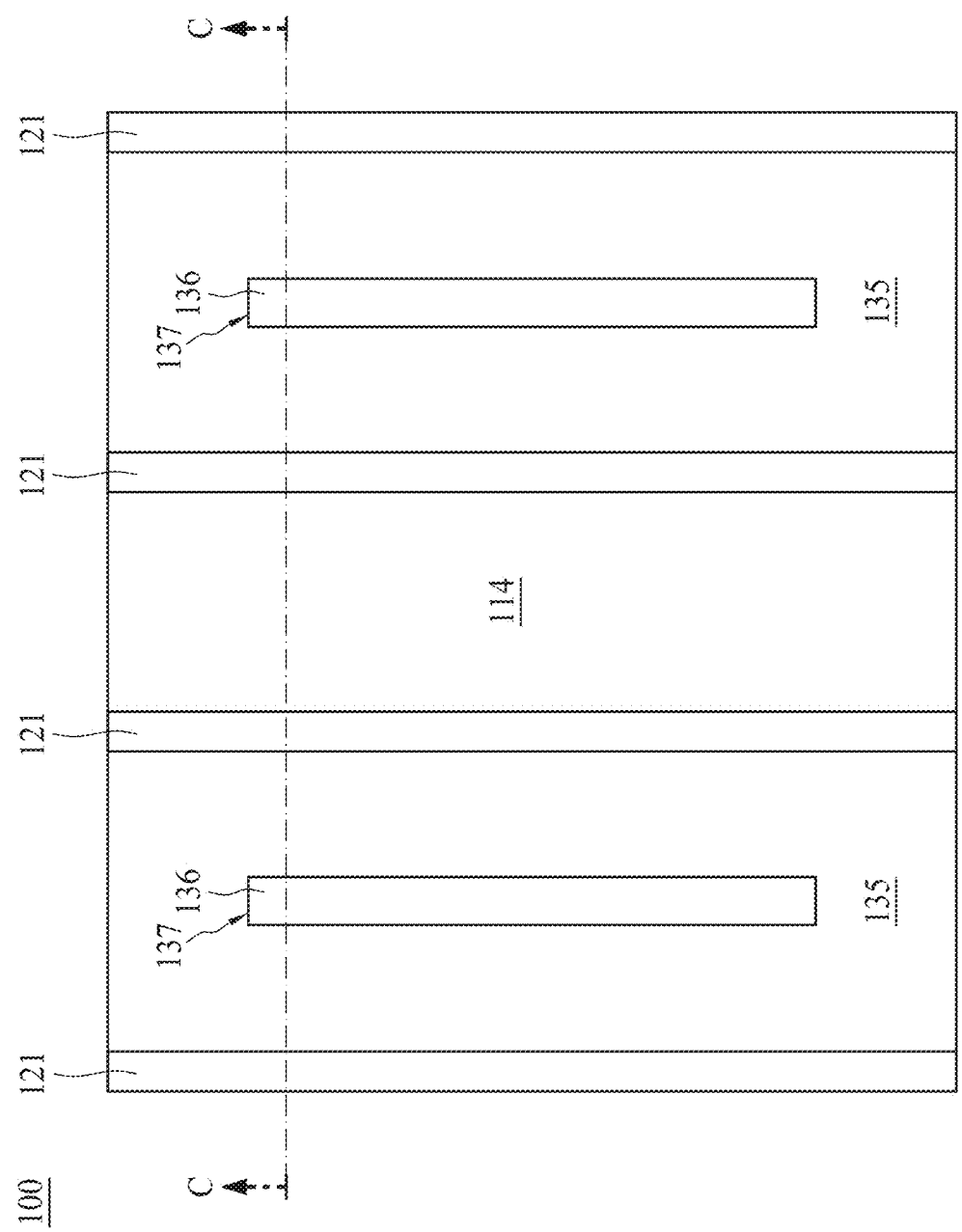
FIG. 13 is a schematic top view of one of the various steps of a method for forming a semiconductor structure in accordance with some embodiments of the present disclosure.
Figure 14:
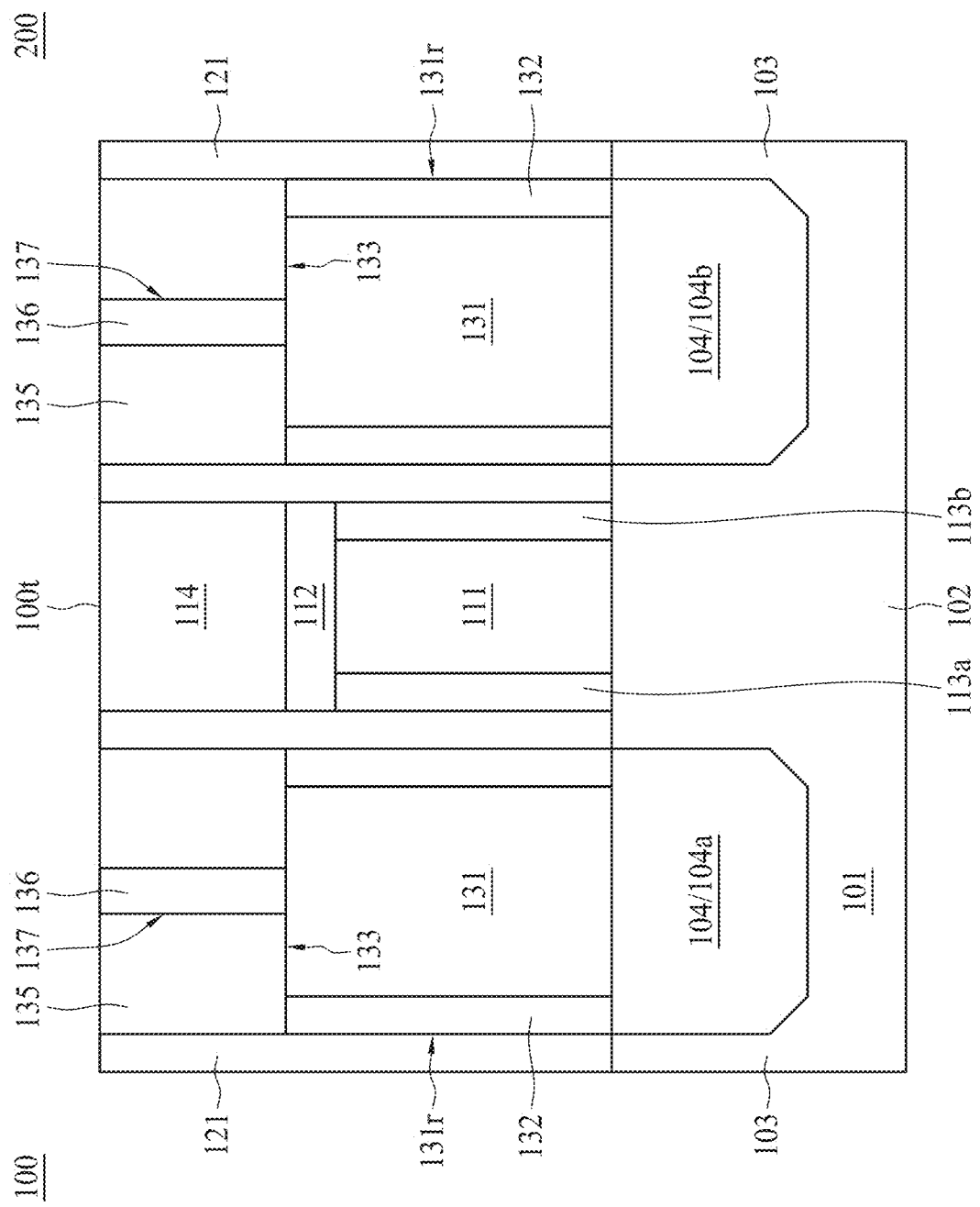
FIG. 14 is a schematic cross-sectional diagram taken along a line C-C in FIG. 13.

FIG. 13 is a schematic top view illustrating a semiconductor structure in accordance with some embodiments of the present disclosure. FIG. 14 is a schematic cross-sectional view taken along a line C-C in FIG. 13. In some embodiments, the method M20 further includes forming a contact 136 disposed on the cobalt-containing member 131 and electrically connected to the epitaxial structures 104 and the cobalt-containing member 131. The contact 136 and the cobalt-containing member 131 are metal patterns that provide electrical interconnections through and within the ILD 121. In some embodiments, the contact 136 is surrounded by the dielectric member 135. In some embodiments, the contact 136 overlaps the corresponding cobalt-containing member 131 from a top view perspective. Persons having ordinary skill in the art would understand that the number of the contacts 136 formed in each of the alignment members 135 merely serves as an exemplary illustration, and different numbers of contacts 136 can be included.

In some embodiments, the contact 136 is formed by removing a portion of the dielectric member 135 above the cobalt-containing member 131 to form a third recess 137. In some embodiments, an etching operation is performed on the dielectric member 135 to remove the portion of the dielectric member 135 above the cobalt-containing member 131 to form the third recess 137. In some embodiments, the contact 136 is disposed in the third recess 137 above the cobalt-containing member 131. In some embodiments, the contact 136 includes metallic material, conductive material or any other suitable material. In some embodiments, the contact 136 is formed by electroplating, sputtering or another suitable technique. In some embodiments, the contact 136 is formed to cover the top surface 100t of the semiconductor structure 100. In some embodiments, a planarization (e.g., CMP) is performed on the top surface 100t of the semiconductor structure 100 to remove portions of the contact 136 until the ILD 121, the dielectric member 135 and/or the protective dielectric layer 114 is exposed as shown in FIGS. 13 and 14. In some embodiments, after the planarization, the contact 136 has a top surface substantially coplanar with a top surface of the ILD 121. In some embodiments, the contact 136 is over a top surface 133 of the cobalt-containing member 131, In some embodiments, the contact 136 is over the corresponding epitaxial structures 104.

Some embodiments of the present disclosure provide a method of etching a cobalt-containing member in a semiconductor structure. The method includes: providing an etchant including a fluorine-free acid and an alkaline solution having a pH value between 8.5 and 13; and etching the cobalt-containing member in the semiconductor structure using the etchant, wherein a rate of etching the cobalt-containing member by the etchant is substantially greater than a rate of etching a nitride-containing member by the etchant.

In some embodiments, the method further includes: adjusting a pH value of the etchant to a value between 2 and 6; and adjusting a pH value of the fluorine-free acid to a value between 2 and 6. In some embodiments, the nitride-containing member at least partially surrounds the cobalt-containing member. In some embodiments, the fluorine-free acid is selected from a group consisting of: aliphatic monocarboxylic acids having 1 to 18 carbon atoms, aliphatic dicarboxylic acids having 1 to 2 carbon atoms, aromatic carboxylic acids, sulfonic acids having 1 to 20 carbon atoms, hydrochloric acid hydrobromic acid, sulfuric acid, sulfurous acid, phosphoric acid, phosphorous acid, polyphosphoric acid, nitric acid and perchloric acid. In some embodiments, the fluorine-free acid is hydrochloric acid. In some embodiments, the alkaline solution includes an alkaline compound, wherein the alkaline compound is selected from a group consisting of: ammonia solution, ethylamine, diethylamine, dimethylethanolamine, tetramethylammonium hydroxide, tetraethyl ammonium hydroxide, tetrapropylammonium hydroxide, tetrabutylammonium hydroxide, benzyltrimethyiammonium hydroxide, choline, pyrrole, piperidine, 8-diazabicyclo-[5,4,0]-7-undecene, sodium hydroxide, potassium hydroxide, sodium carbonate, sodium bicarbonate, sodium silicate, and sodium metasilicate. In some embodiments, the alkaline solution includes ammonia solution. In some embodiments, the method further includes: adjusting a level of dissolved oxygen of the etchant to less than or substantially equal to 100 ppb. In some embodiments, the method further includes: adjusting a concentration of the fluorine-free acid to a value between 0.1 vol % and 10 vol %, and adjusting a concentration of the alkaline solution to a value between 0.1 vol % and 10 vol %. In some embodiments; the rate of etching the cobalt-containing, member by the etchant is substantially greater than a rate of etching an oxide-containing member by the etchant. In some embodiments, the rate of etching the nitride-containing member by the etchant is substantially equal to zero.

Some embodiments of the present disclosure provide a method for forming a semiconductor structure. The method includes: receiving a substrate including a plurality of epitaxial structures over the substrate; forming a gate structure over the substrate and between two of the plurality of epitaxial structures; disposing a conductive material over one of the plurality of epitaxial structures and adjacent to the gate structure; and removing a portion of the conductive material using an etchant, wherein the etchant includes a fluorine-free acid and an alkaline solution having a pH value between 8.5 and 13.

In some embodiments, the conductive material includes cobalt. In some embodiments, the portion of the conductive material is removed to form a surface, wherein the surface is substantially level with the gate structure. In some embodiments, the portion of the conductive material is removed to form a surface having a surface roughness between 5 and 15 nm. In some embodiments, the method further includes: disposing a nitride-containing material over the substrate and surrounding the gate structure and the conductive material. In some embodiments, the nitride-containing material includes titanium nitride. In some embodiments; the etchant includes hydrochloric acid and ammonia solution.

Some embodiments of the present disclosure provide an etchant for etching a cobalt-containing member in a semiconductor structure. The etchant includes: a fluorine-free acid; and an alkaline solution having a pH value between 8.5 and 13; wherein a rate of etching a cobalt-containing member by the etchant is substantially greater than a rate of etching a nitride-containing member by the etchant, and a level of dissolved oxygen of the etchant is substantially less than or equal to 100 ppb.

In some embodiments, the etchant is free of benzene.

The foregoing outlines structures of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of etching a cobalt-containing member in a semiconductor structure, comprising:
    providing an etchant including a fluorine-free acid and an alkaline solution, wherein the alkaline solution has a pH value between 8.5 and 13;
    adjusting a level of dissolved oxygen of the etchant to less than or equal to 100 ppb; and
    etching the cobalt-containing member in the semiconductor structure using the etchant,
    wherein a rate of etching the cobalt-containing member by the etchant is greater than a rate of etching a nitride-containing member by the etchant.

2. The method of claim 1,
    wherein a pH value of the fluorine-free acid ranges between 2 and 6.

3. The method of claim 1, wherein the nitride-containing member at least partially surrounds the cobalt-containing member.

4. The method of claim 1, wherein the fluorine-free acid is selected from a group consisting of: aliphatic monocarboxylic acids wherein the aliphatic group comprises 1 to 18 carbon atoms, aliphatic dicarboxylic acids having an aliphatic group with 1 to 2 carbon atoms, aromatic carboxylic acids, sulfonic acids having 1 to 20 carbon atoms, hydrochloric acid, hydrobromic acid, sulfuric acid, sulfurous acid, phosphoric acid, phosphorous acid, polyphosphoric acid, nitric acid and perchloric acid.

5. The method of claim 1, wherein the fluorine-free acid is hydrochloric acid.

6. The method of claim 1, wherein the alkaline solution includes an alkaline compound, wherein the alkaline compound is selected from a group consisting of: ammonia solution, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, 1,8-diazabicyclo-[5,4,0]-7-undecene, sodium hydroxide, potassium hydroxide, sodium carbonate, sodium bicarbonate, and sodium silicate.

7. The method of claim 1, wherein the alkaline solution includes ammonia solution.

8. The method of claim 1,
    wherein a pH value of the etchant ranges between 2 and 6.

9. The method of claim 1, further comprising:
    adjusting a concentration of the fluorine-free acid to a value between 0.1 vol % and 10 vol %, and adjusting a concentration of the alkaline solution to a value between 0.1 vol % and 10 vol %.

10. The method of claim 1, wherein the rate of etching the cobalt-containing member by the etchant is greater than a rate of etching an oxide-containing member by the etchant.

11. The method of claim 1, wherein the rate of etching a nitride-containing member by the etchant is equal to zero.

12. A method of etching a cobalt-containing member in a semiconductor structure, comprising:
    providing the semiconductor structure including a substrate, a plurality of epitaxial structures over the substrate, a gate structure over the substrate and between two of the plurality of epitaxial structures;
    disposing the cobalt-containing member over one of the plurality of epitaxial structures and adjacent to the gate structure; and
    etching a portion of the conductive material using an etchant,
    wherein the etchant includes a fluorine-free acid and an alkaline solution, wherein the alkaline solution has a pH value between 8.5 and 13.

13. The method of claim 12, wherein the cobalt-containing member is etched to form a surface having a surface roughness between 5 and 15 nm.

14. The method of claim 13, wherein the surface is free of residues disposed thereon.

15. The method of claim 12, further comprising:
    disposing a nitride-containing material over the substrate and surrounding the gate structure and the cobalt-containing member.

16. The method of claim 15, wherein the nitride-containing material includes titanium nitride.

17. A method of etching a cobalt-containing member in a semiconductor structure, comprising:
    providing the semiconductor structure including the cobalt-containing member disposed over an epitaxial structure and surrounded by a nitride-containing member; and
    etching a portion of the cobalt-containing member using an etchant; and
    exposing at least a portion of the nitride-containing member after the cobalt-containing member is etched,
    wherein the etchant includes a fluorine-free acid and an alkaline solution, wherein the alkaline solution has a pH value between 8.5 and 13.

18. The method of claim 17, wherein the etchant is free of benzene.

19. The method of claim 17, wherein the etchant includes hydrochloric acid and ammonia solution.

20. The method of claim 17, wherein the cobalt-containing members has a width between 10 and 50 nm.

* * * * *